(12) United States Patent
Geurts et al.

(10) Patent No.: US 10,250,834 B2
(45) Date of Patent: Apr. 2, 2019

(54) METHODS AND APPARATUS FOR A VOLTAGE-SHIFTING READOUT CIRCUIT

(71) Applicant: SEMICONDUCTOR COMPONENTS INDUSTRIES, LLC, Phoenix, AZ (US)

(72) Inventors: Tomas Geurts, Haasrode (BE); Joris De Bondt, Kontich (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 20 days.

(21) Appl. No.: 15/258,077

(22) Filed: Sep. 7, 2016

(65) Prior Publication Data

US 2018/0070038 A1    Mar. 8, 2018

(51) Int. Cl.
| | |
|---|---|
| *H04N 5/335* | (2011.01) |
| *H04N 5/378* | (2011.01) |
| *H03K 19/0175* | (2006.01) |
| *H03M 3/00* | (2006.01) |
| *H04N 5/374* | (2011.01) |
| *H03M 1/12* | (2006.01) |

(52) U.S. Cl.
CPC ..... *H04N 5/378* (2013.01); *H03K 19/017509* (2013.01); *H03M 3/496* (2013.01); *H04N 5/374* (2013.01); *H03M 1/1245* (2013.01); *H03M 1/1295* (2013.01)

(58) Field of Classification Search
CPC ...................................................... H04N 5/378
USPC ...................................................... 348/300
See application file for complete search history.

(56) References Cited

U.S. PATENT DOCUMENTS

| | | | | |
|---|---|---|---|---|
| 6,038,049 | A * | 3/2000 | Shimizu | H03K 5/082 250/214 A |
| 6,674,389 | B2 | 1/2004 | Bult | |
| 2001/0048383 | A1 | 12/2001 | Nagaraj | |
| 2011/0001648 | A1 | 1/2011 | Ohkawa | |
| 2011/0069211 | A1* | 3/2011 | Jung | H04N 5/378 348/294 |

* cited by examiner

*Primary Examiner* — Usman A Khan
(74) *Attorney, Agent, or Firm* — The Noblitt Group, PLLC; Hettie L. Haines

(57) ABSTRACT

Methods and device for a readout circuit according to various aspects of the present invention may operate in conjunction with a storage device selectively coupled to an input signal having a voltage value within a first voltage range. A comparator may compare the voltage value of the input signal to a predetermined threshold voltage. A level-shifting circuit may shift the first voltage value of the input signal to a second voltage value within a second voltage range if the first voltage value of the input signal is greater than the predetermined threshold voltage.

16 Claims, 9 Drawing Sheets

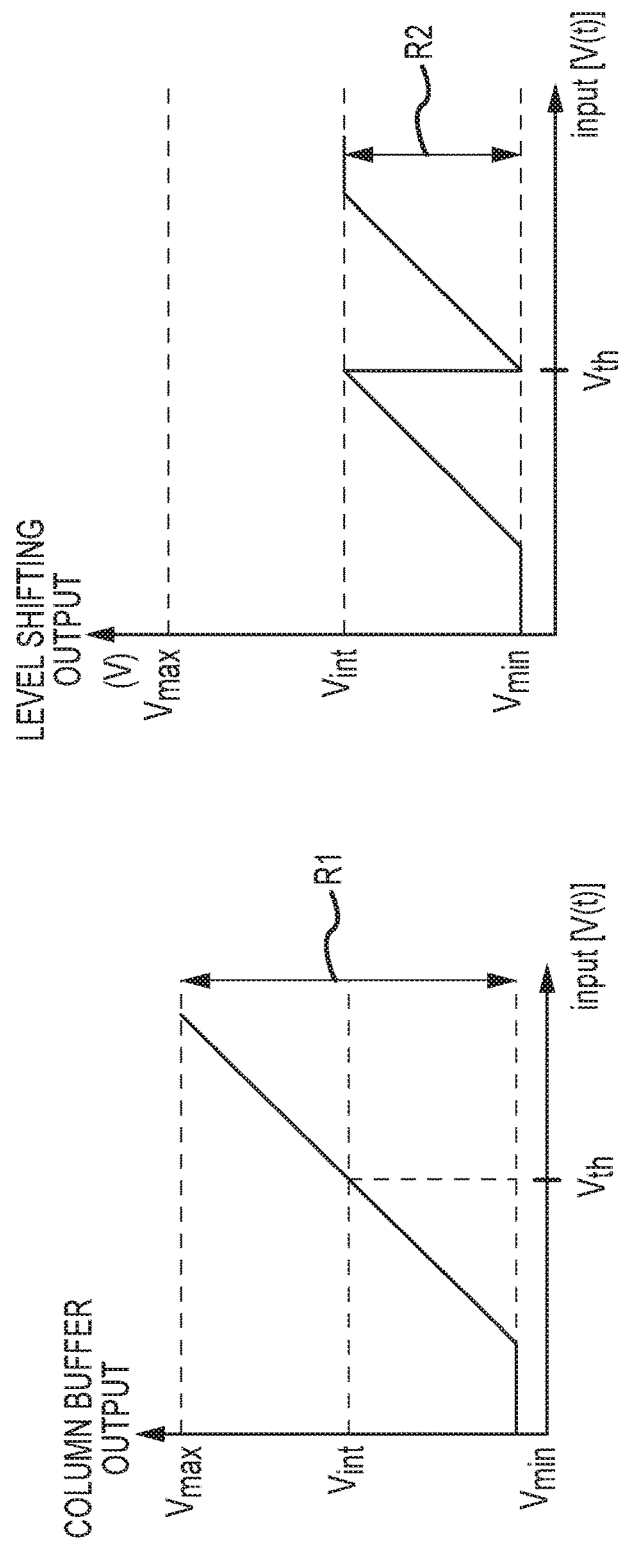

METHODS AND APPARATUS FOR A VOLTAGE-SHIFTING READOUT CIRCUIT

BACKGROUND OF THE TECHNOLOGY

Figure 1:
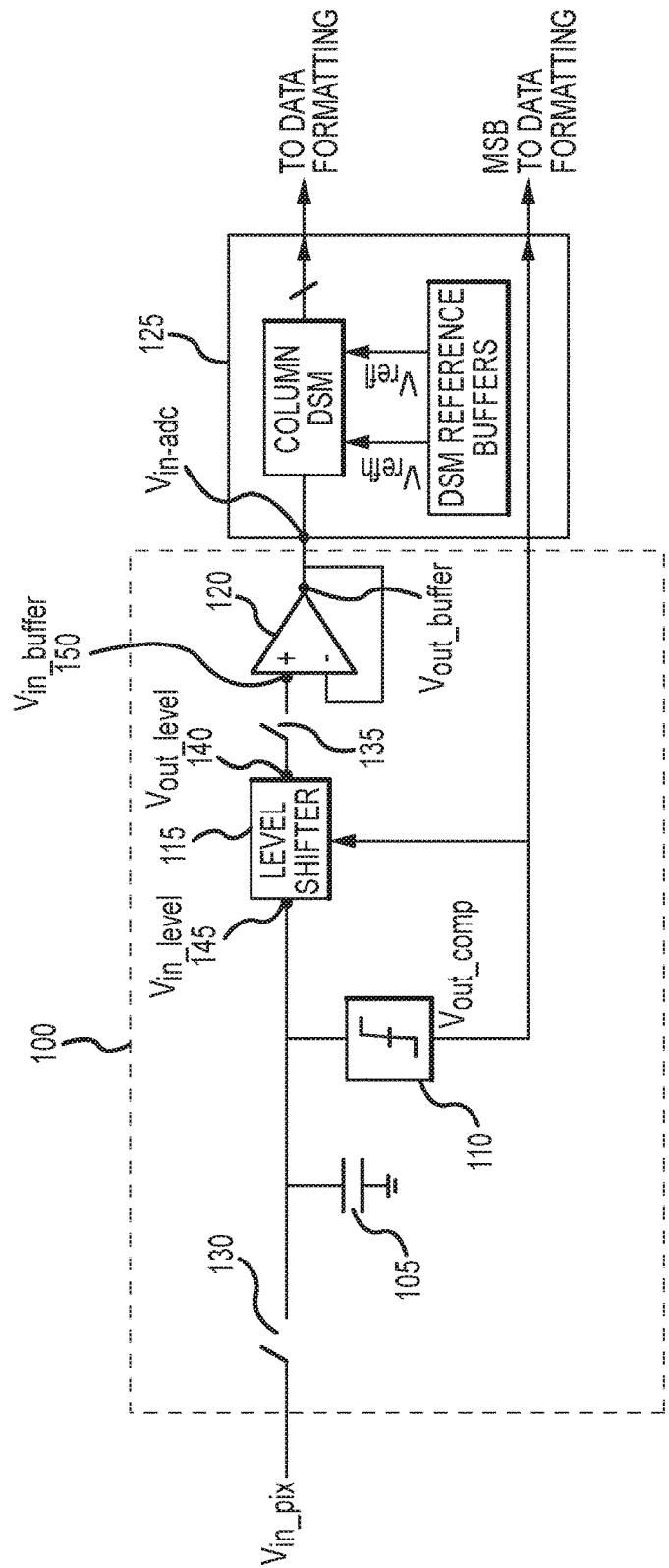

Image sensors utilize analog-to-digital converters (ADCs) to convert the analog pixel signal into a digital signal prior to signal processing. In conventional column readout architectures, each column of the pixel array has a dedicated readout circuit and corresponding ADC. The readout circuit typically includes a sample and hold circuit using a capacitor and a buffer, where the pixel signal is sampled prior to being converted into a digital signal. The maximum voltage for the readout signal may be high (e.g., 3.3V) due to the pixel output swing. As such, the input swing for the ADC must match that of the pixel output swing. Conventional circuits utilize amplifiers to increase the pixel output swing. Matching the high voltage results in the ADC operating at a higher voltage and therefore requires more power, which generally adds to the cost of the device. Other readout circuits have been designed to attenuate the signal, however, signal attenuation results in the loss of information, which introduces bit errors when the signal is converted to a digital signal.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 2:
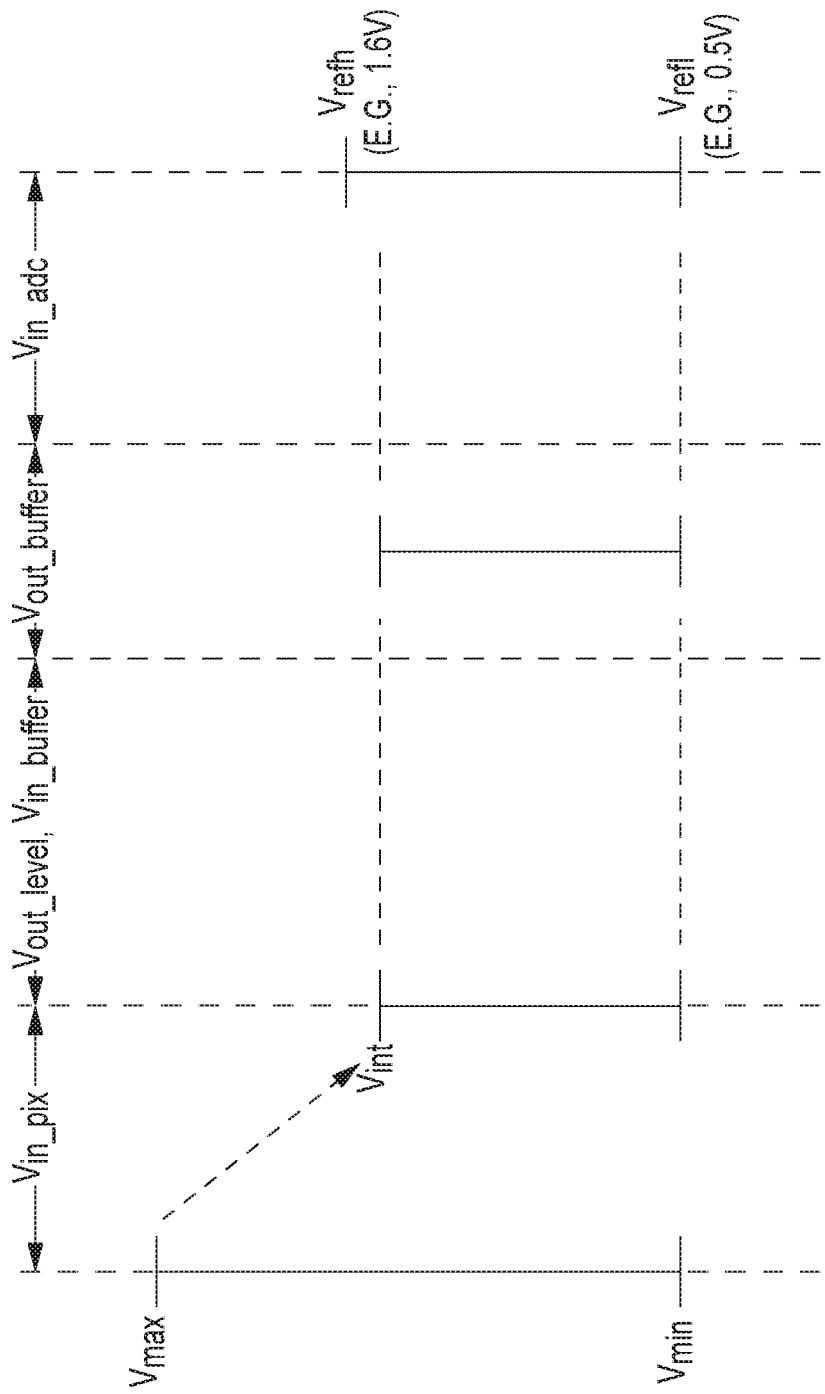
Figure 3A:
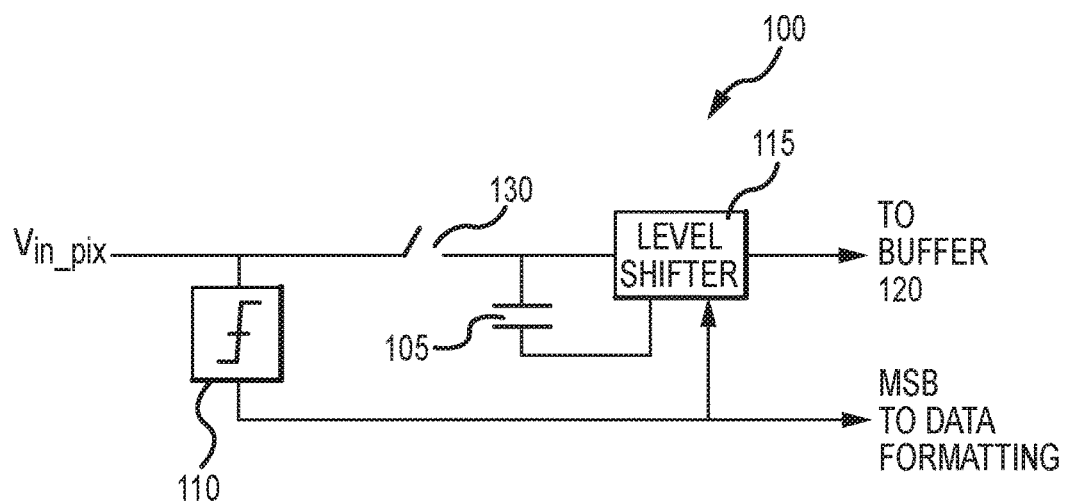
Figure 3B:
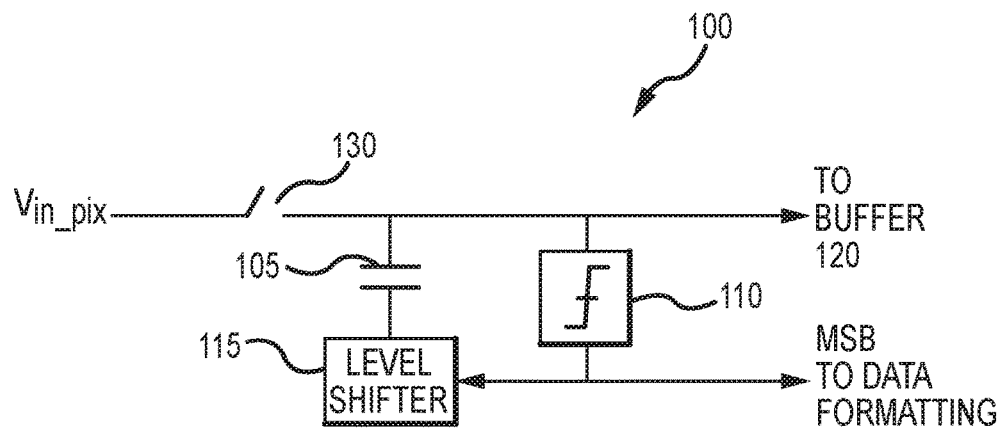
Figure 5:
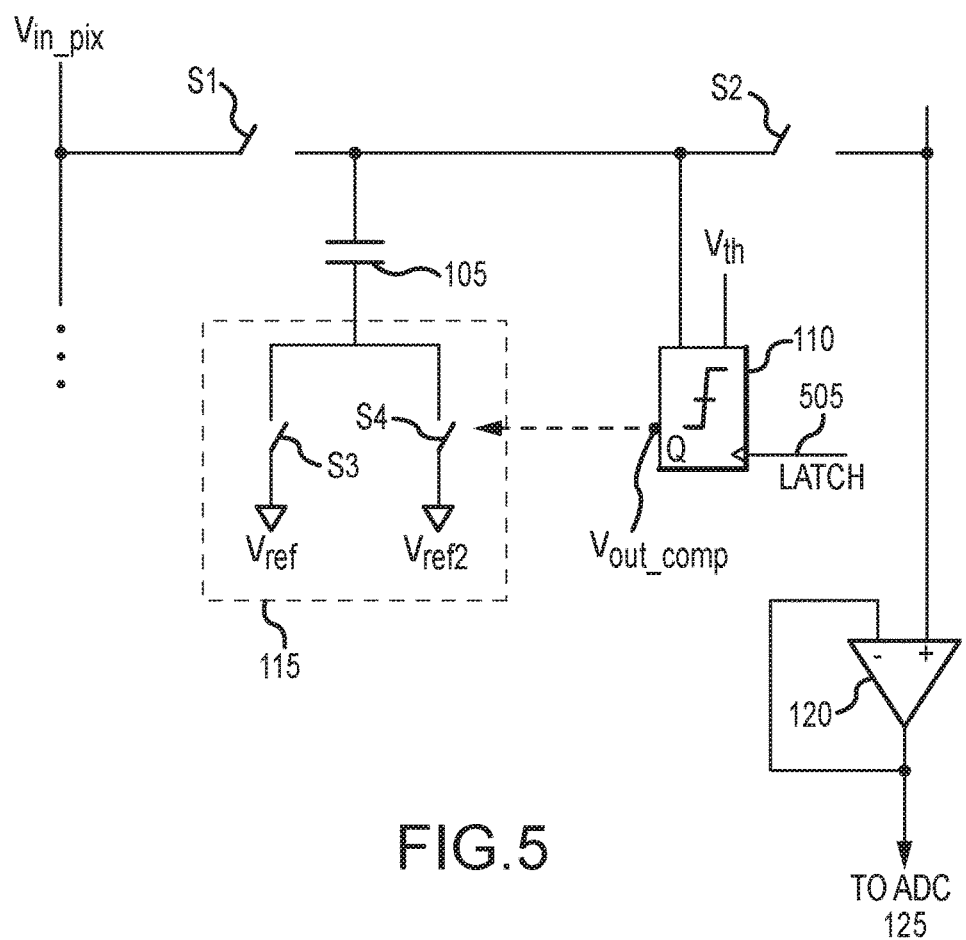
Figure 6:
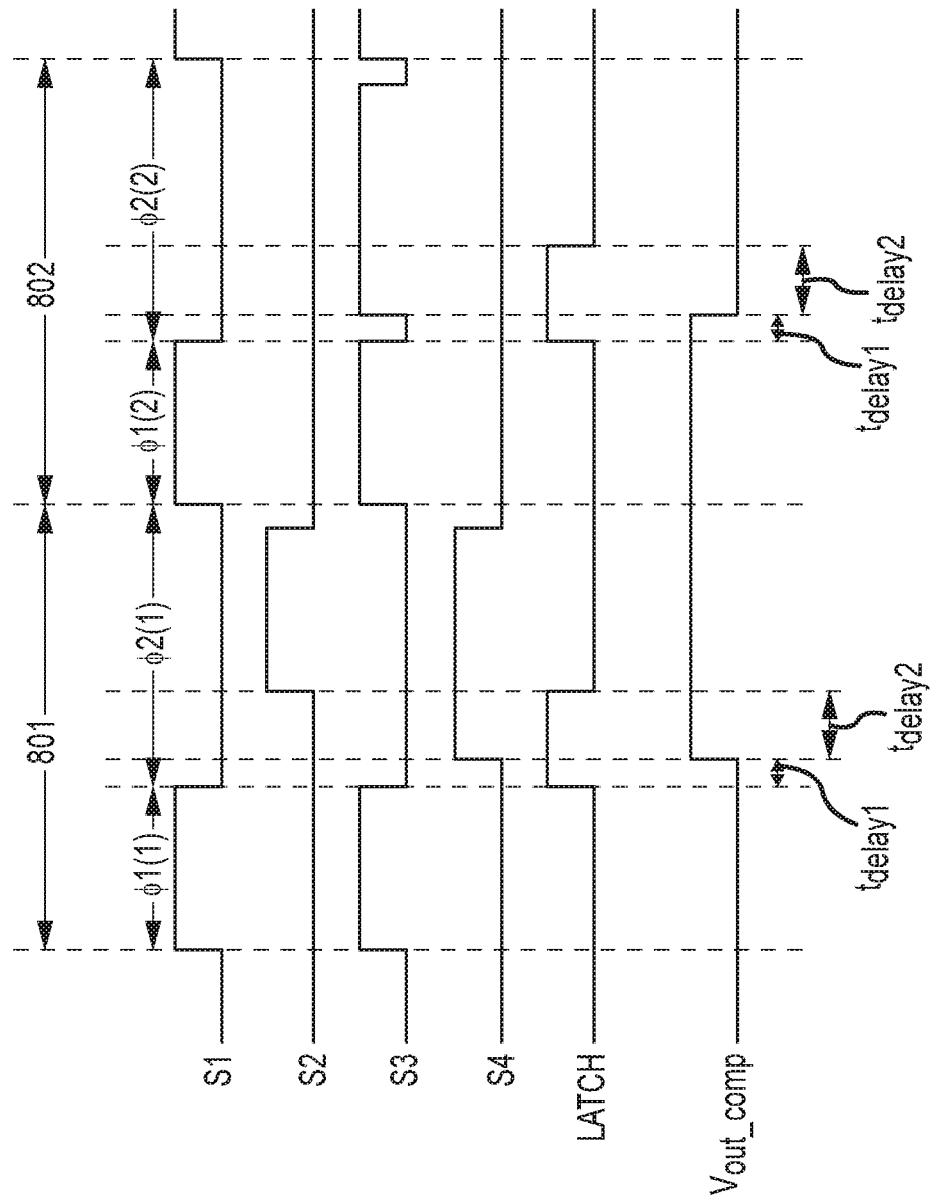
Figure 7:
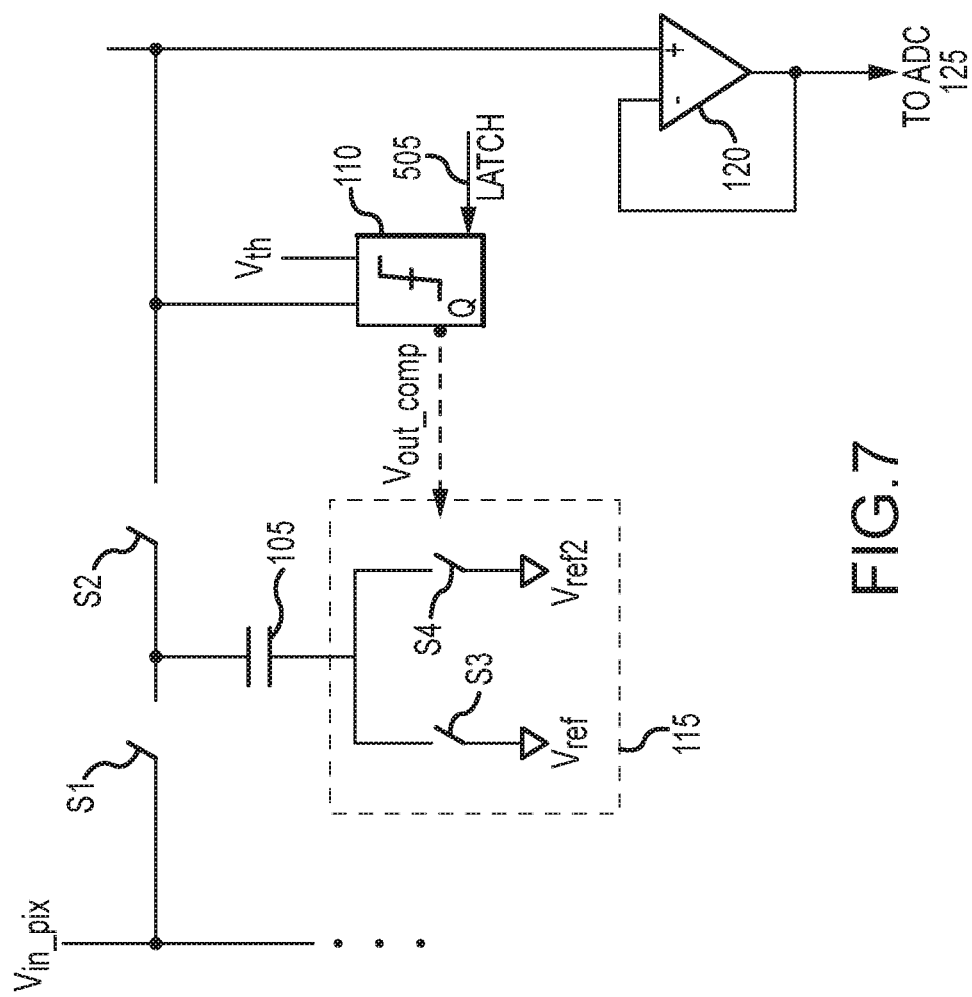
Figure 8:
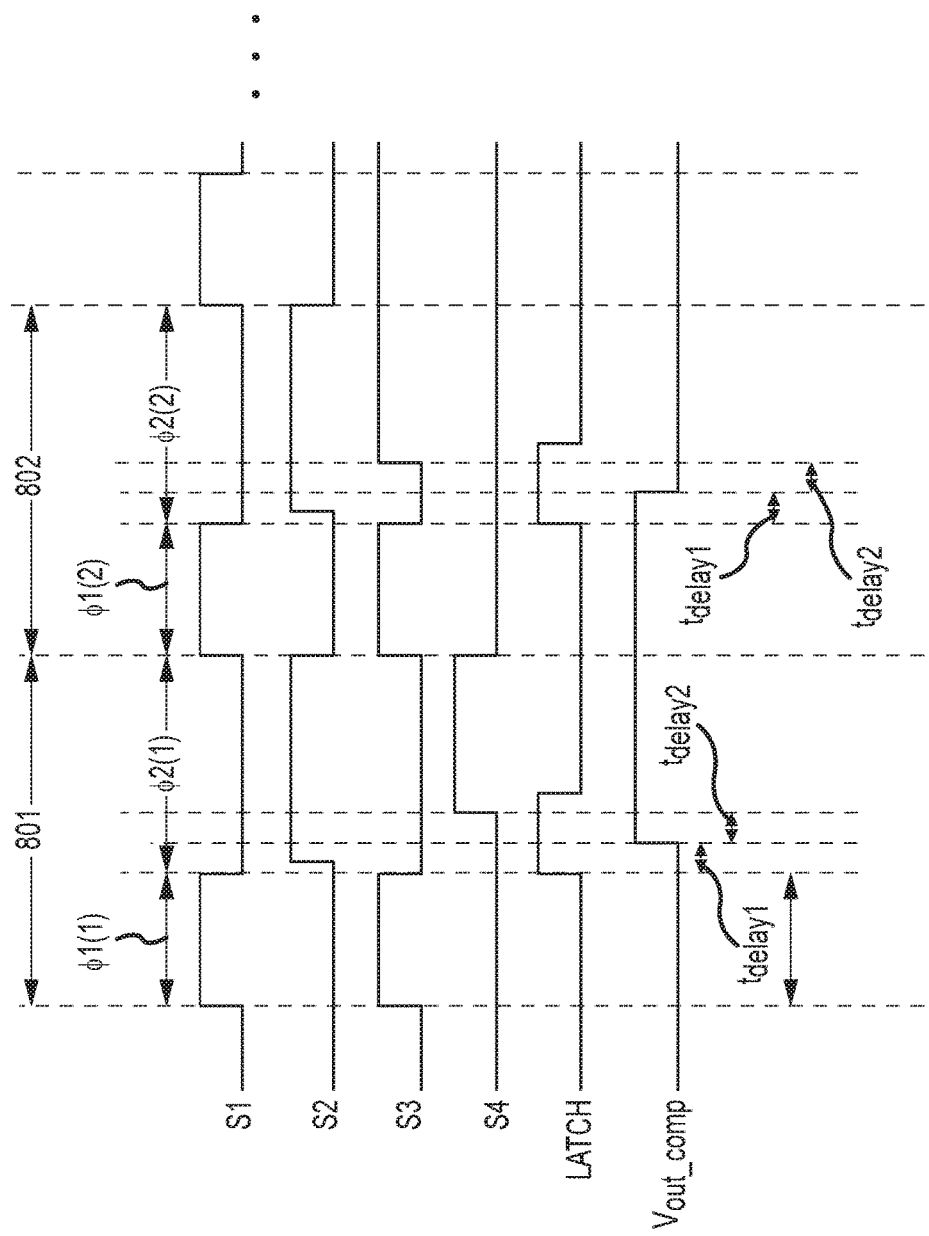
Figure 9:
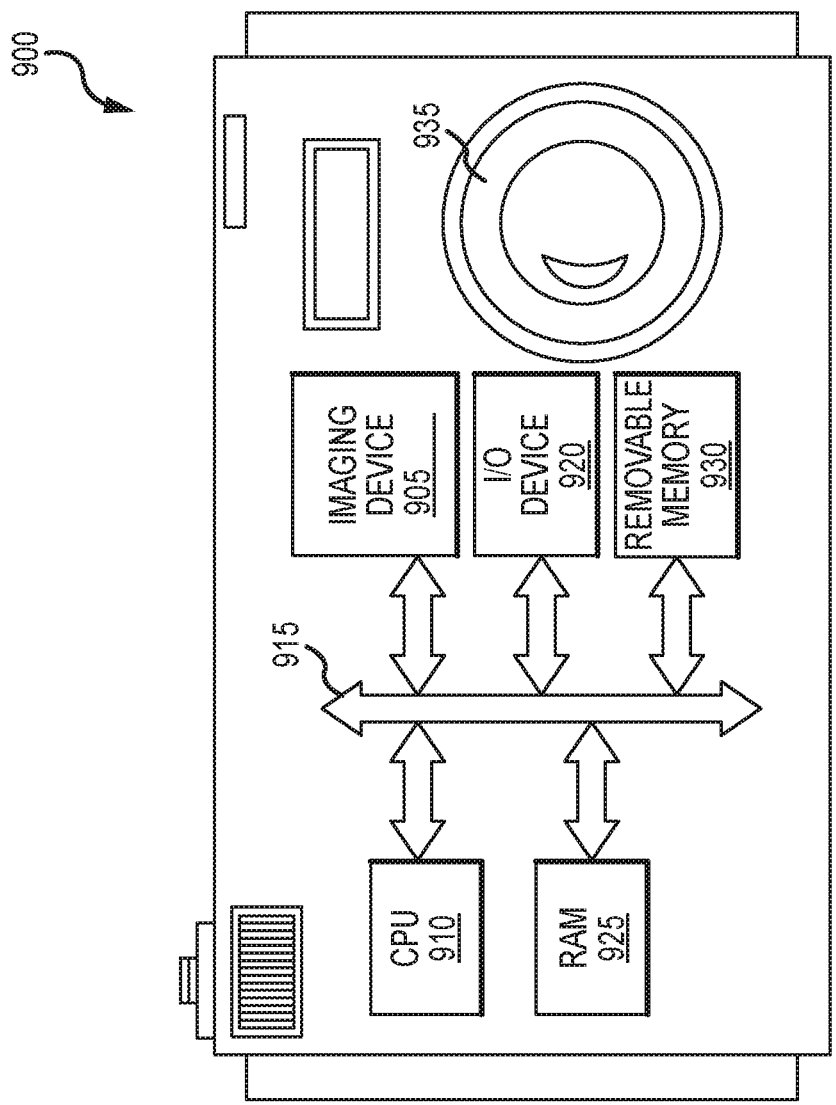

FIG. 1 is a block diagram of a readout circuit in accordance with an exemplary embodiment of the present technology;

FIG. 2 representatively illustrates various voltage ranges for a readout circuit in accordance with an exemplary embodiment of the present technology;

FIGS. 3A-B are schematic drawings of alternative arrangements of a readout circuit in accordance with an exemplary embodiment of the present technology;

FIG. 4A representatively illustrates a transfer function of a conventional readout circuit;

FIG. 4B representatively illustrates a transfer function of a readout circuit in accordance with an exemplary embodiment of the present technology;

FIG. 5 is a schematic of a readout circuit in accordance with an exemplary embodiment of the present technology;

FIG. 6 representatively illustrates a timing diagram in accordance with an exemplary embodiment of the present technology;

FIG. 7 is a schematic of a readout circuit in accordance with an exemplary embodiment of the present technology;

FIG. 8 representatively illustrates a timing diagram in accordance with an exemplary embodiment of the present technology; and FIG. 9 representatively illustrates a system in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various semiconductor devices, such as transistors, capacitors, and the like, which may carry out a variety of functions. In addition, the present technology may be practiced in conjunction with any number of imaging systems, and the apparatus described is merely one exemplary application for the technology. Further, the present technology may employ any number of conventional techniques for capturing light and converting the light into an electric charge, reading out the charge as a pixel signal with a voltage value, sampling the voltage of the pixel signals, converting the analog pixel signal into a digital signal, and the like.

Methods and apparatus for a readout circuit according to various aspects of the present technology may operate in conjunction with any suitable imaging system, such as a computer system, camera system, machine vision system, vehicle navigation system, video telephone, surveillance system, auto focus system, star tracker system, motion detection system, image stabilization system, smartphone, and the like. The readout circuit 100 may accumulate charge generated by one or more pixels and transfer the resultant signal to an ADC for conversion to a digital value.

Referring now to FIG. 9, an exemplary imaging system according to various aspects of the present invention may comprise an electronic device, such as a digital camera 900. The imaging system may comprise a central processing unit (CPU) 910 that communicates with various devices over a bus 915. Some of the devices connected to the bus 915 may provide communication into and out of the system, for example an input/output (I/O) device 920. Other devices connected to the bus 915 provide memory, for example, a random access memory (RAM) 925, hard drive, and one or more removable memory devices 930, such as a floppy disk drive, compact disk (CD) drive, USB drives, memory cards and SD cards. While the bus 915 is illustrated as a single bus, any number of busses may be used to provide communication paths to interconnect the devices.

The imaging system may further comprise an imaging device 905 for capturing image data. The imaging device 905 may comprise a plurality of pixels, for example arranged in rows and columns to form a pixel array. In an exemplary embodiment, each pixel comprises a photodetector, such as a photodiode, for capturing light and converting light into an electric signal. The signal produced by the pixel is an analog signal which may be converted into a digital signal prior to signal processing. As such, the imaging device 905 may employ one or more analog-to-digital converters (ADC) 125 (FIG. 1). For example, in a per-column ADC, each column of the pixel array has an associated ADC, while other architectures (i.e., chip level) may comprise only one ADC. Prior to digital conversion, the pixel signal may undergo sampling, shifting, and the like.

In various embodiments, the imaging device 905 may be combined with a processor, such as the CPU 910, a digital signal processor, or a microprocessor, in a single integrated circuit, or may be on a separate chip. The imaging device 905 may be a CMOS imager constructed in accordance with any of suitable technology and/or control methods. The imaging device 905 may also receive control or other data from the system as well, such as a shutter release.

In various embodiments, the electronic device may further comprise a lens 935 configured to focus an image on the pixel array. For example, the lens 935 may include a fixed and/or adjustable lens and may include microlenses formed on an imaging surface of the imaging device 905.

Referring now to FIG. 1, in an exemplary embodiment of the present technology, the readout circuit 100 may operate in conjunction with the ADC 125, in this case a delta-sigma modulator. While the exemplary readout circuit 100 operates in conjunction with a delta-sigma modulator, any suitable ADC may be used. In the present embodiment, the readout circuit 100 receives an analog pixel signal Vin_pix from the pixel array at an input, and the readout circuit 100 may sample, shift, and transmit corresponding signals to the ADC 125. In various embodiments, the output of the ADC 125 may be transmitted to a data formatting unit or other system for further processing and/or filtering.

The readout circuit 100 may comprise a comparator 110 and a level-shifting circuit 115. The comparator 110 compares the pixel signal value to a reference value and generates a corresponding signal if the pixel value exceeds the reference value. The comparator 110 may comprise any appropriate system or device for comparing the pixel signal value to the reference value, such as a conventional comparator circuit having two voltage inputs and a voltage output. For example, the exemplary comparator 110 of the present embodiment may comprise two input terminals (i.e., first and second input terminals) and one output terminal. The comparator 110 compares the input voltages and generates an output signal indicating which of the two input voltages is larger. In an exemplary embodiment, the comparator 110 receives the input pixel voltage Vin_pix at the first terminal and a threshold voltage at the second terminal (not shown), such as a static predetermined voltage value. If the input pixel voltage Vin_pix is larger than the threshold voltage, the comparator 110 outputs a digital "1." Conversely, if the input pixel voltage Vin_pix is less than the threshold voltage, the comparator 110 outputs a digital "0." In an exemplary embodiment, the comparator 110 output Vout_comp is transmitted to the level-shifting circuit 115 and to the data formatting unit (not shown). In other embodiments, the comparator 110 may be configured as a multi-level comparator 110 for multi-bit comparison.

In various embodiments, the comparator 110 may provide a most significant bit signal to the data formatting unit according to the input signal.

The level-shifting circuit 115 generates a signal corresponding to the pixel signal value and responds to the comparator 110. If the comparator 110 output signal indicates that the pixel signal value exceeds the threshold, the level-shifting circuit 115 shifts the value of its output signal to a smaller value.

In the present exemplary embodiment, the level-shifting circuit 115 may comprise any suitable circuit and/or semiconductor device for receiving an input voltage Vin_level at an input 145 and selectively producing a corresponding but shifted output voltage Vout_level at an output 140, such as a lower output voltage than the input voltage Vin_level.

Various embodiments of the level-shifting circuit 115 may comprise switching devices, such as transistors, configured to receive the comparator output Vout_comp, wherein the switching device may selectively couple to one or more reference potentials. In various embodiments, the level-shifting circuit receives the input voltage Vin_level corresponding to a pixel voltage value at a given time, and outputs the voltage Vout_level, wherein the maximum voltage value of the output signal Vout_level_max is less than the maximum voltage value of the input signal Vin_level_max.

In other embodiments, the level-shifting circuit 115 may be configured as a multi-level level-shifting circuit to operate with a multi-level comparator 110.

The readout circuit 100 may further comprise a storage device 105 for storing a voltage value. The storage device may be coupled to the pixel input Vin_pix. For example, the storage device 105 may comprise a capacitive element that provides memory through a stored electrostatic field, such as a conventional capacitor.

The storage device 105 may be utilized in conjunction with a switch to sample the voltage of the input signal Vin by storing electric charge. For example, the readout circuit 100 may further comprise a first switching device 130 for selectively connecting the input signal to the storage device 105. The first switching device 130 may receive a control signal from a control unit (not shown). The first switching device 130 responds by "opening" and "closing," wherein "open" may be defined as inhibiting current flow, and "closed" may be defined as allowing current flow. For example, the first switching device 130 may comprise a device responsive to a control signal, such as a transistor responsive to a control signal or any other suitable device to selectively facilitate current flow.

The readout circuit 100 may further comprise a buffer 120 for temporarily storing data. In an exemplary embodiment, the buffer 120 may receive an input Vin_buffer at a positive input terminal 150 which corresponds to the level-shifting circuit output Vout_level, and produces an output Vout_buffer. The buffer output Vout_buffer may be transmitted to the ADC 125.

The readout circuit 100 may further comprise a second switching device 135 for selectively connecting the output 140 of the level-shifting circuit 115 to the input of the positive input terminal 150 of the buffer 120. The second switching device 135 may receive a control signal from the control unit. The second switching device 135 responds by "opening" and "closing" accordingly. For example, the second switching device 135 may comprise a device responsive to a control signal, such as a transistor responsive to a control signal or any other suitable device to facilitate current flow.

In various embodiments, the readout circuit 100 operates to reduce the voltage swing (i.e., range) of the input signal without attenuating the signal. In an exemplary embodiment, the storage device 105 samples the voltage of the input signal. The comparator 110 receives the sampled value at the first input terminal and the threshold voltage at the second input terminal. The comparator 110 compares the sampled value and the threshold value Vth. The comparator 110 then outputs a binary value representing the outcome of the comparison. The comparator 110 output Vout_comp is then transmitted to the level-shifting circuit 115 and to the data formatting unit (not shown). The level-shifting circuit 115 responds to the comparator output Vout_comp, such that if the level-shifting circuit 115 receives a binary "1," then the level-shifting circuit 115 activates to shift the voltage to a new value (i.e., a shifted value). The shifted value is then transmitted to the buffer 120 where it is temporarily stored prior to transmission to the ADC. This process of sampling, comparing, selectively activating the level-shifting circuit 115, and storing the new value continues until the entire pixel array has been read out.

The readout circuit 100 may be arranged in any manner suitable to generate an output signal having a reduced range while maintaining precision of the signal, such as shifting the level of the output signal in response to a comparison of the input voltage to one or more thresholds and/or generating additional bits or other information according to the level shifting operations. FIG. 1 illustrates one embodiment of the readout circuit 100, while FIGS. 3A-B illustrate alternative embodiments of the readout circuit 100.

Referring now to FIG. 2, in operation, the readout circuit 100 may generate various voltage ranges via the level-shifter 115 output Vout_level, the buffer 120 output Vout_buffer, and the ADC 125 input Vin_adc in relation to the pixel input Vin. In an exemplary embodiment, the pixel input Vin_pix comprises a voltage range from a minimum voltage Vmin_pix to a maximum voltage Vmax_pix. The level-shifter 115 produces a maximum output voltage Vout_level_max which is less than the maximum pixel input voltage Vmax_pix. The input voltage range of the buffer 120 (i.e. Vin_buffer min to Vin_buffer max) may be equal to, or substantially equal to, the output range of the level-shifter 115 (i.e., Vout_level_min to Vout_level_max). Similarly, the output voltage range of the buffer 120 (i.e., Vout_buffer min to Vout_buffer max) may be equal to, or substantially equal to, the input range of the buffer 120.

In various embodiments, the ADC 125 operates with a minimum reference voltage Vrefl and a maximum reference voltage Vrefh. The maximum input pixel voltage Vmax_pix may be higher than the maximum reference voltage Vrefh, but the maximum output of the level-shifter 115 Vmax_level is less than or equal to the maximum reference voltage Vrefh. Additionally, the minimum input pixel voltage Vmin_pix and minimum level-shifter 115 output voltage Vout_level_min may be greater than or equal to the minimum reference voltage Vrefl.

Referring now to FIGS. 4A-B, in operation, the voltage behavior of the readout circuit 100 may be illustrated with transfer curves. As illustrated in FIG. 4A, the transfer curve describes the voltage level of the input signal as a function of time versus the output voltage of the buffer 120 as if the level-shifting circuit 115 was absent. The graph illustrates that the input voltage increases as a function of time and the output voltage of the buffer also increases as a function of time, wherein the voltage values have a first voltage range R1 from a minimum voltage Vmin to a maximum Vmax.

FIG. 4B illustrates a transfer curve describing the voltage level of the input signal as function of time versus the output voltage the level-shifting circuit 115. The graph illustrates that the input voltage increases as a function of time. Once the input voltage reaches a predetermined threshold voltage Vth, the level-shifter shifts the voltage to a lower voltage, wherein the voltage values have a second voltage range R2. The second voltage range R2 may be defined as voltage values between the minimum voltage Vmin and an intermediate voltage Vint, wherein the intermediate voltage Vint is less than the maximum voltage Vmax. Subsequent signals with voltages above the threshold voltage Vth are also shifted to the second voltage range R2.

Referring now to FIGS. 5 and 7, in various embodiments, the readout circuit 100 comprises the storage device 105, the comparator 110, the buffer 120, and the level-shifting circuit 115.

In various embodiments the readout circuit 100 may further comprise first and second switching devices S1, S2 to selectively couple various components of the readout circuit 100.

In various embodiments, the storage device 105 may comprise a top plate and a bottom plate to store electrical charge, for example a capacitor. The top plate of the storage device 105 is selectively coupled to the input signal Vin_pix via the first switching device S1. The bottom plate of the storage device 105 is coupled to the level-shifting circuit 115.

In various embodiments, the level-shifting circuit 115 comprises third and fourth switching devices S3, S4. The third switching device S3 may be selectively coupled to a first reference voltage Vref, while the fourth switching device S4 may be selectively coupled to a second reference voltage Vref2. In the current embodiment, the third and fourth switching devices S3, S4 may receive the comparator output signal Vout_comp.

In various embodiments, the comparator 110 may be equipped with a latch 505 for switching between a hold state and a comparing state. The latch 505 may be responsive to a latch signal LATCH received from the control unit. When the latch 505 is enabled (i.e., the latch signal LATCH is a high value), the comparator 110 is in the comparing state. Alternatively, when the latch 505 is disabled (i.e., the latch signal LATCH is a low value), the comparator 110 is in the holding state. In general, when the latch 505 is enabled, the comparator output Vout_comp is continuously updated by the sign of the net differential input signal. Conversely, when the latch 505 is disabled, the comparator output Vout_comp goes to either a logic "1" or a logic "0" depending on the sign of the differential input signal at the instant of the transition.

In various embodiments, the comparator 110 may transmit an output signal Vout_comp to the level-shifting circuit 115.

Referring to FIG. 5, in one embodiment, the first switching device S1 selectively couples the input signal Vin_pix to the storage device 105, and the second switching device S2 selectively couples the comparator 110 and storage device 105 to the buffer 120.

Referring to FIG. 7, in an alternative embodiment, the first switching device S1 selectively couples the input signal Vin_pix to the storage device 105, and the second switching device S2 selectively couples the storage device 105 to the comparator 110 and to the buffer 120.

Referring to FIGS. 5 and 6, in one embodiment, during a first phase φ1(1), the first and third switching devices S1, S3 receive a high value (the switches are "closed"). In the present embodiment, the input signal Vin_pix is coupled to the top plate of the storage device 105, via the first switching device S1, while the bottom plate is coupled to the first reference voltage Vref via the third switching device S3. The second and fourth switching devices S2, S4 receive a low value (the switches are "open") during the first phase φ1(1). In various embodiments, the first switching device S1 may receive a control signal from the control unit for coupling the input signal Vin_pix to the storage device 105. The voltage of the input signal Vin_pix is then sampled for a predetermined period of time.

During a second phase φ2(1), the first and third switching devices S1, S3 receive a low voltage value ("open") and the latch 505 is enabled. The comparator 110 compares the voltage across the storage device 105 to the threshold voltage Vth. If the voltage across the storage device 105 is greater than the threshold voltage Vth, the comparator 110 transmits the digital value "1" (as illustrated with reference to the second phase φ2(1) of a first sample 801) to the level-shifting circuit 115. If the digital value "1" is received by the level-shifting circuit 115, the fourth switching device S4 receives a high value ("closed"), such that the bottom plate of the storage device 105 couples to the second reference voltage Vref2, while the third switching device S3 maintains a low value ("open"). Coupling the bottom plate of the storage device 105 to the second reference voltage Vref2 subtracts an offset value from the voltage across the storage device 105. After the latch is disabled, the second switching device S2 receives a high value ("closed") to couple the storage device 105 to the buffer 120.

Alternatively, if the voltage across the storage device 105 is less than the threshold voltage Vth, the comparator 110 transmits the digital value "0" (as illustrated with reference to a second phase φ2(2) of a second sample 802) to the level-shifting circuit 115. If the digital value "0" is received by the level-shifting circuit 115, then the fourth switching device S4 remains at a low value (stays "open"), while the third switching device S3 receives a high value ("closed"). The voltage across the storage device 105 is input to the buffer 120 where the voltage value is temporarily stored before it is transmitted to the ADC 125.

In various embodiments, a first timing delay $t_{delay1}$ may be present between the rising edge of the latch signal LATCH and the comparator output signal Vout_comp. Additionally, a second timing delay $t_{delay2}$ may be present between the rising edge of the comparator output signal Vout_comp and the rising edge of the switching device signals S3, S4.

In an alternative embodiment and referring to FIGS. 7 and 8, during a first phase φ1(1), the first and third switching devices S1, S3 receive a high value (the switches are "closed"). In the present embodiment, the input signal Vin_pix is coupled to the top plate of the storage device 105, via the first switching device S1, while the bottom plate is coupled to the first reference voltage Vref via the third switching device S3. The second and fourth switching devices S2, S4 receive a low value (the switches are "open") during the first phase φ1(1). In various embodiments, the first switching device S1 may receive a control signal from the control unit for coupling the input signal Vin_pix to the storage device 105. The voltage of the input signal Vin_pix is then sampled for a predetermined period of time.

During a second phase φ2(1), the first and third switching devices S1, S3 receive a low voltage value ("open"), the latch 505 is enabled, and the second switching device S2 receives a high value ("closed") to couple the storage device 105 to the comparator 110. The comparator 110 compares the voltage across the storage device 105 to the threshold voltage Vth. If the voltage across the storage device 105 is greater than the threshold voltage Vth, the comparator 110 transmits the digital value "1" (as illustrated with reference to a first sample 801) to the level-shifting circuit 115. If the digital value "1" is received, the fourth switching device S4 receives a high value ("closed"), such that the bottom plate of the storage device 105 couples to the second reference voltage Vref2, while the third switching device S3 maintains a low value ("open"). Coupling the bottom plate of the storage device 105 to the second reference voltage Vref2 subtracts an offset from the voltage across the storage device 105.

Alternatively, if the voltage across the storage device 105 is less than the threshold voltage Vth, the comparator 110 transmits the digital value "0" (as illustrated with reference to a second sample 802) to the level-shifting circuit 115. If the digital value "0" is received, then the fourth switching device S4 remains at low value (stays "open"), while the third switching device S3 receives a high value ("closed"). The voltage across the storage device 105 is input to the buffer 120 where the voltage value is temporarily stored before it is transmitted to the ADC 125.

In various embodiments, a first timing delay $t_{delay1}$ may be present between the rising edge of the latch signal LATCH and the comparator output signal Vout_comp. Additionally, a second timing delay $t_{delay2}$ may be present between the rising edge of the comparator output signal Vout_comp and the rising edge of the switching device signals S3, S4.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

While the technology has been described with reference to specific exemplary embodiments, various modifications and changes may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A readout circuit, comprising:
a storage device selectively coupled to an input signal and configured to sample the input signal, wherein the input signal has a first voltage value within a first voltage range;
a comparator coupled to the input signal, wherein the comparator compares the first voltage value of the input signal to a predetermined threshold voltage; and
a level-shifting circuit coupled to the storage device and responsive to the comparator, wherein the level-shifting circuit shifts the first voltage value of the input signal to a second voltage value within a second voltage range if the first voltage value of the input signal is greater than the predetermined threshold voltage.

2. The readout circuit of claim 1, wherein the storage device comprises a top and bottom plate.

3. The readout circuit of claim 2, wherein the level-shifting circuit comprises a first switch to selectively couple the bottom plate of the storage device to a first reference voltage.

4. The readout circuit of claim 3, wherein the level-shifting circuit comprises a second switch to selectivity couple the bottom plate of the storage device to a second reference voltage to subtract an offset value from the input signal.

5. The readout circuit of claim 4, wherein the comparator transmits a control signal to the level-shifting circuit to couple the second switch to the second reference voltage.

6. The readout circuit of claim 1, further comprising a buffer coupled to the storage device.

7. The readout circuit of claim 1, further comprising a delta sigma modulator coupled to the level-shifting circuit and operative at the second voltage range, wherein the modulator converts the input signal into a digital signal.

8. The readout circuit of claim 1, wherein the level-shifting circuit subtracts an offset value from the sampled input signal if the input signal is greater than the predetermined threshold voltage.

9. The readout circuit of claim 1, wherein the comparator provides a most significant bit signal to a data formatting unit according to the input signal.

10. A imaging system, comprising:
a pixel array comprising pixels arranged in rows and columns;
a storage device comprising a top plate and a bottom plate, wherein the top plate is coupled to the pixel array and samples the voltage of an input pixel signal, and wherein the sampled input pixel signal has a first voltage range;
a comparator coupled to the storage device, wherein the comparator compares the sampled input pixel signal to a predetermined threshold voltage;
a level-shifting circuit coupled to the bottom plate of the storage device and responsive to the comparator, wherein the level-shifting circuit shifts the sampled input pixel signal to a second voltage range if the sampled input pixel signal exceeds the predetermined threshold voltage;
an analog-to-digital converter coupled to the level-shifting circuit and configured to convert the sampled input pixel signal to a digital signal; and
an output device coupled to the analog-to-digital converter and configured to display an image according to the digital signal.

11. The imaging system of claim 10, wherein the level-shifting circuit comprises a first switch to selectively couple the bottom plate of the storage device to a first reference voltage.

12. The imaging system of claim 11, wherein the level-shifting circuit further comprises a second switch to selectivity couple the bottom plate of the storage device to a second reference voltage to subtract an offset value from the input signal.

13. The imaging system of claim 12, wherein the comparator provides a control signal to the second switch to couple the second switch to the second reference voltage.

14. The imaging system of claim 10, wherein, further comprising a buffer coupled between the storage device and the analog-to-digital converter.

15. The imaging system of claim 10, wherein the comparator converts and transmits the most significant bit of the input signal to a data-formatting unit.

16. The imaging system of claim 10, wherein analog-to-digital converter comprises a delta-sigma modulator.

* * * * *